US008063654B2

(12) United States Patent
Rahman et al.

(10) Patent No.: US 8,063,654 B2
(45) Date of Patent: Nov. 22, 2011

(54) APPARATUS AND METHOD FOR TESTING OF STACKED DIE STRUCTURE

(75) Inventors: Arifur Rahman, San Jose, CA (US); Hong-Tsz Pan, Cupertino, CA (US); Bang-Thu Nguyen, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 321 days.

(21) Appl. No.: 12/505,215

(22) Filed: Jul. 17, 2009

(65) Prior Publication Data
US 2011/0012633 A1 Jan. 20, 2011

(51) Int. Cl.
*G01R 31/26* (2006.01)
(52) U.S. Cl. ............... 324/762.03; 324/762.06
(58) Field of Classification Search ............ 324/762.03
See application file for complete search history.

(56) References Cited

U.S. PATENT DOCUMENTS

| | | | |
|---|---|---|---|
| 5,781,031 A | 7/1998 | Bertin et al. | |
| 5,825,080 A * | 10/1998 | Imaoka et al. | 257/659 |
| 6,337,579 B1 | 1/2002 | Mochida | |
| 6,781,226 B2 | 8/2004 | Huppenthal et al. | |
| 6,875,921 B1 | 4/2005 | Cobb | |
| 6,917,219 B2 | 7/2005 | New | |
| 7,084,478 B2 * | 8/2006 | Lee et al. | 257/516 |
| 7,098,542 B1 | 8/2006 | Hoang et al. | |
| 7,224,184 B1 * | 5/2007 | Levi et al. | 326/41 |
| 7,233,061 B1 | 6/2007 | Cobb | |
| 7,327,592 B2 * | 2/2008 | Silvestri | 365/63 |
| 7,518,398 B1 | 4/2009 | Rahman et al. | |
| 7,768,123 B2 * | 8/2010 | Liu et al. | 257/723 |
| 2004/0178819 A1 | 9/2004 | New | |
| 2004/0262635 A1 | 12/2004 | Lee | |
| 2006/0220672 A1 | 10/2006 | Sato | |
| 2007/0051949 A1 | 3/2007 | Schneider et al. | |
| 2007/0152708 A1 | 7/2007 | Madurawe et al. | |
| 2008/0042140 A1 | 2/2008 | Alam et al. | |

OTHER PUBLICATIONS

U.S. Appl. No. 11/701,807, filed Feb. 1, 2007, Rahman et al.
U.S. Appl. No. 11/973,245, filed Oct. 4, 2007, Rahman et al.
U.S. Appl. No. 12/128,459, filed May 28, 2008, Trimberger et al.
Baliga, John et al., *Through-Silicon Technology, Applications Growing*, Mar. 1, 2005, pp. 1-3, available from Semiconductor International, 2000 Clearwater Drive, Oak Brook, IL 60523 or www.semiconductor.net.

(Continued)

*Primary Examiner* — Huy Q Phan
*Assistant Examiner* — Joshua Benitez
(74) *Attorney, Agent, or Firm* — Kenneth Glass; LeRoy D. Maunu; Lois D. Cartier (57) ABSTRACT

An integrated circuit device includes a stacked die and a base die having probe pads that directly couple to test logic of the base die to implement a scan chain for testing of the integrated circuit device. The base die further includes contacts disposed on a back side of the base die and through-die vias coupled to the contacts and coupled to programmable logic of the base die. The base die also includes a first probe pad configured to couple test input, a second probe pad configured to couple test output, and a third probe pad configured to couple control signals. Test logic of the base die is configured to couple to additional test logic of the stacked die to implement the scan chain. The probe pads are coupled directly to the test logic such that configuration of the programmable logic is not required to implement the scan chain.

20 Claims, 9 Drawing Sheets

OTHER PUBLICATIONS

Garrou, Phillip, *Future ICs Go Vertical*, Feb. 1, 2005, pp. 1-10, available from Semiconductor International, 2000 Clearwater Drive, Oak Brook, IL 60523 or www.semiconductor.net.

Guarini, K. W. et al., "Electrical Integrity of State-of-the-Art 0.13 μm SOI CMOS Devices and Circuits Transferred for Three-Dimensional (3D) Integrated Circuit (IC) Fabrication," *Proc. of the 2002 IEEE International Electron Devices Meeting (IEDM'02)*, Dec. 8-11, 2002, pp. 943-945, San Francisco, California, USA.

Ieong, Meikei et al., Three Dimensional CMOS Devices and Integrated Circuits, *Proc. of the 2003 IEEE Custom Integrated Circuits Conference*, Sep. 21-24, 2003, pp. 207-213, San Jose, California, USA.

Rahman, A. et al., "Die Stacking Technology for Terabit Chip-to-Chip Communications," *Proc. of the 2006 IEEE Custom Integrated Circuits Conference*, Sep. 10-13, 2006, pp. 587-590, San Jose, California, USA.

* cited by examiner

```
┌─────────────────────────────────────────────────┐
│ FORM PROGRAMMABLE LOGIC DEVICE DIE THAT INCLUDES│
│ THROUGH DIE VIAS THAT ARE COUPLED TO TEST LOGIC OF│
│THE PROGRAMMABLE LOGIC DEVICE DIE AND THAT INCLUDES│
│   PROBE PADS DIRECTLY COUPLED TO THE TEST LOGIC │
└─────────────────────────────────────────────────┘
                                              601
                         ↓
┌─────────────────────────────────────────────────┐
│      ATTACH STACKED DIE TO THE BACKSIDE OF THE  │
│   PROGRAMMABLE LOGIC DEVICE DIE, THE STACKED DIE│
│  INCLUDING ADDITIONAL TEST LOGIC THAT COUPLES TO THE│
│   TEST LOGIC OF THE PROGRAMMABLE LOGIC DEVICE DIE│
└─────────────────────────────────────────────────┘
                                              602
                         ↓
        ┌─────────────────────────────────┐
        │  COUPLE STAND-ALONE TESTING DEVICE│
        │        TO THE PROBE PADS          │
        └─────────────────────────────────┘
                                          603
                         ↓
┌─────────────────────────────────────────────────┐
│ OPERATE STAND-ALONE TESTING DEVICE SO AS TO TEST THE│
│  PROGRAMMABLE LOGIC DEVICE DIE (WITHOUT CONFIGURING│
│         THE PROGRAMMABLE LOGIC DEVICE DIE)      │
└─────────────────────────────────────────────────┘
                                              604
```

APPARATUS AND METHOD FOR TESTING OF STACKED DIE STRUCTURE

FIELD OF THE INVENTION

Embodiments of the present invention relate generally to integrated circuit design and, more particularly, to a method and apparatus for testing stacked-die integrated circuit assemblies.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes configurable logic blocks (CLBs), programmable input/output blocks (IOBs), and other types of logic blocks, such as memories, microprocessors, digital signal processors (DSPs), and the like. The CLBs, IOBs, and other logic blocks are interconnected by a programmable interconnect structure. The CLBs, IOBs, logic blocks, and interconnect structure are typically programmed by loading a stream of configuration data (known as a bitstream) into internal configuration memory cells that define how the CLBs, IOBs, logic blocks, and interconnect structure are configured.

As semiconductor technology has advanced, the amount and speed of logic available on a PLD has increased more rapidly than the number and performance of I/O connections. As a result, IC die stacking techniques have been developed in which two or more ICs are stacked vertically and interconnections are made between them. In conventional stacked-die fabrication processes, semiconductor fabrication process steps are performed on a wafer so as to form a number of die on the wafer that are typically referred to as "base die." Through-die vias are formed that extend through the wafer. The wafer is then thinned so as to expose the through-die vias and a grid array of contacts are formed on the back side of the wafer that connect to the exposed through-die vias. Typically a grid array of contacts are also formed on the face side of the base die for coupling the base die to a package substrate. One or more stacked die are then attached to the back side of each base die using micro bumps.

When the stacked-die fabrication process forms a programmable logic device such as a FPGA, the FPGA die is the base die and the stacked die are devices that provide additional functionality. For example, the stacked die can be memory devices that add additional memory storage.

Conventional FPGA wafer testing is typically performed by attaching a testing device to the face side of the wafer such that it connects to the grid array of contacts on the face side of the base die. Configuration of each FPGA die is then performed by loading a bitstream into the programmable logic that "programs" the die. Test data is then loaded into the die through the contacts on the face side of the base die and shifted through test circuitry of the base die to identify defects.

Though conventional testing processes are effective for identifying defective stacked-die assemblies prior to singulation, they are time consuming. In particular, the configuration process takes a considerable amount of time, resulting in increased manufacturing cost. Accordingly, there exists a need in the art for a method and apparatus that will allow for more efficient testing of stacked-die assemblies.

SUMMARY OF THE INVENTION

An integrated circuit device is disclosed that includes a stacked die and a base die having a first plurality of contacts disposed on a back side of the base die, a second plurality of contacts disposed on a face side of the base die, a first plurality of through-die vias coupled to the first plurality of contacts and coupled to programmable logic of the base die. In addition, the integrated circuit device includes a plurality of probe pads including a first probe pad configured to couple test input, a second probe pad configured to couple test output and a third probe pad configured to couple control signals. The integrated circuit device also includes test logic configured to couple to additional test logic of the stacked die so as to implement a scan chain for testing of the integrated circuit device. In accordance with aspects of the present invention, the first probe pad, the second probe pad and the third probe pad are coupled directly to the test logic such that configuration of the programmable logic is not required for coupling the test input, the test output and the control signal between the base die and the stacked die so as to implement the scan chain.

A method for testing is disclosed in which an integrated circuit die is formed on a semiconductor wafer. The integrated circuit die includes a plurality of through-die vias coupled to test logic of the integrated circuit die and a plurality of probe pads directly coupled to the test logic. The method includes attaching a stacked die to the back side of the integrated circuit die, the stacked die including additional test logic that couples to the test logic of the integrated circuit die. A stand-alone testing device is coupled to the probe pads, and the stand-alone testing device may be operated so as to test the integrated circuit die, without configuration of a routing fabric of the integrated circuit die.

The method and apparatus of the present invention provide for testing of the base die and the stacked die without requiring configuration of the base die. Thereby, the testing process takes significantly less time than conventional processes that require configuration of the base die, saving manufacturing time and resulting in cost savings. These and other advantages of the present invention will become obvious to those of ordinary skill in the art after having read the following detailed description of the preferred embodiments, which are illustrated in the various drawings.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Figure 1:
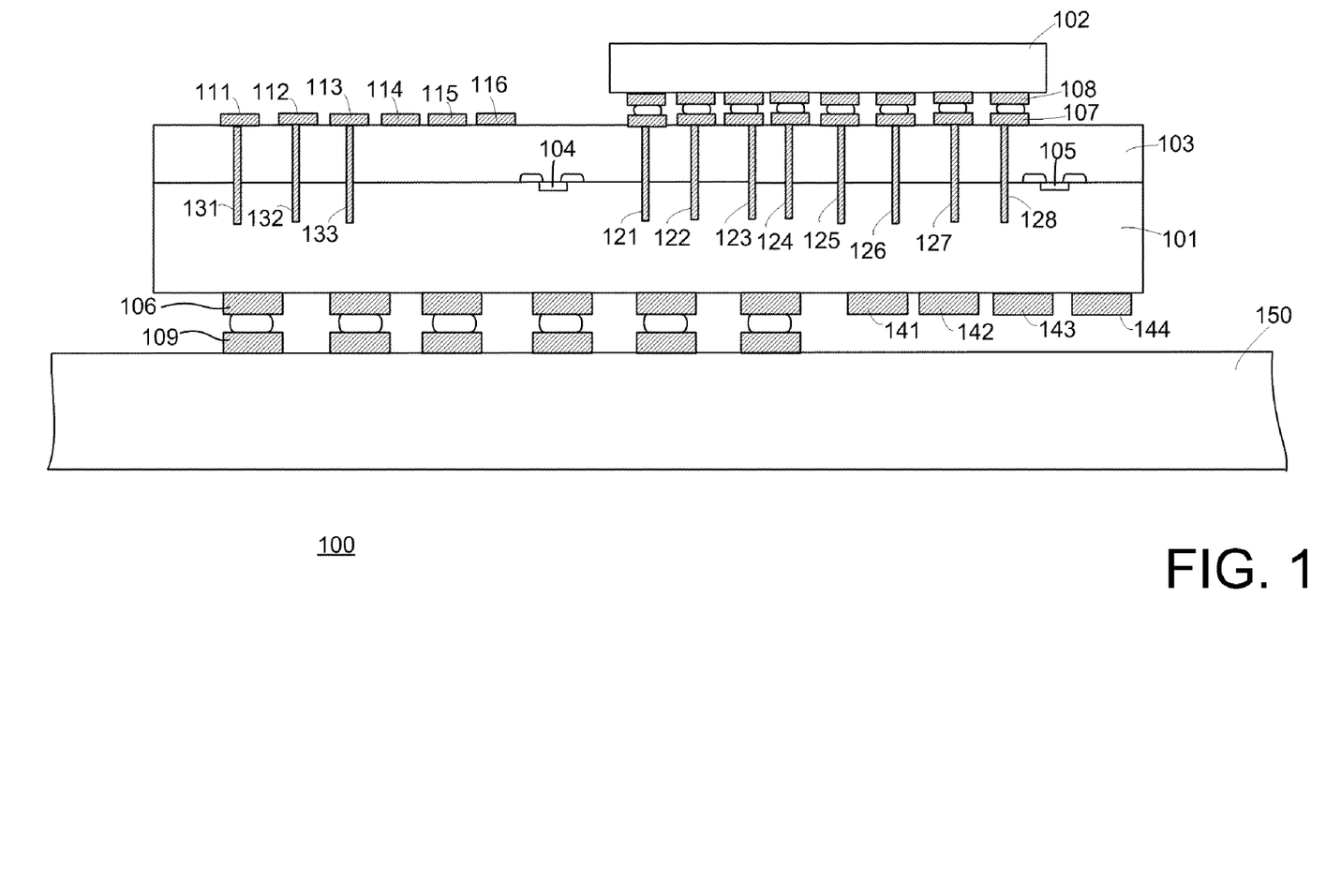
FIG. 1 is a block diagram depicting a stacked-die assembly that includes a base die and a stacked die that is coupled to the base die in accordance with an embodiment of the invention.

FIG. 1 shows an integrated circuit device 100 that includes a base die 101 and a stacked die 102 that is coupled to the back side of base die 101. Base die 101 includes a first set of contacts 107 that are formed the back side of base die 101 and a second set of contacts 106 that are formed on the face side of base die 101. In the present embodiment stacked die 102 is vertically stacked with base die 101, such that the face side of stacked die 102 is mounted to the back side of base die 101, with both of die 101-102 configured for face-down mounting in flip-chip fashion.

In one embodiment contacts 107 are a grid array of contacts that couple to a corresponding grid array of contacts 108 on stacked die 102 using micro bumps. Base die 101 and stacked die 102 may be any type of digital, analog, or mixed-signal integrated circuit device. In one embodiment base die 101 has a significantly greater surface area than stacked die 102 and more than one stacked die 102 is coupled to the back side of base die 101.

Base die 101 includes operational circuitry 105, symbolically represented by a transistor, formed on semiconductor substrate 103. Operational circuitry 105 can form any of a number of different types of integrated circuit devices, including but not limited to application specific integrated circuit devices, digital signal processors, etc. In the present embodiment, base die 101 is a programmable logic device such as, for example, a field programmable gate array (FPGA) logic device. In this embodiment base die 101 includes operational circuitry 105 that includes programmable logic that couples to contacts 106-107 for providing input to, and output from base die 101 during normal operation of base die 101 and stacked die 102. Through-die vias 121-128 and 131-133 extend through semiconductor substrate 103. The first set of through-die vias 121-128 couple to contact pads 107, and some or all of through-die vias 121-128 couple to the programmable logic of base die 101.

Continuing with FIG. 1, base die 101 includes probe pads 111-116 that are disposed on the back side of base die 101. A first probe pad, test input probe pad 111, is configured to couple test input. A second probe pad, test output probe pad 112, is configured to couple test output. A third probe pad, test control probe pad 113, is configured to couple control signals. Additional probe pads such as probe pads 114-116 couple other test-related signals to base die 101 and stacked die 102.

A second set of through-die vias, represented by through-die vias 131-133, are dedicated to testing of base die 101. The second set of through-die vias includes a first through-die via 131 that is connected to probe pad 111 for coupling the test input, a second through-die via 132 that is connected to probe pad 112 for coupling the test output, and a third through-die via 133 that is connected to probe pad 113 for coupling the control signals.

Base die 101 also includes test logic 104, symbolically represented by a transistor, formed on semiconductor substrate 103. Test logic 104 is configured to couple to additional test logic of stacked die 102 so as to implement a scan chain for testing of integrated circuit device 100. Furthermore, probe pads 111-113 are directly coupled to the test logic such that configuration of the programmable logic is not required for coupling the test input, the test output and the control signal between base die 101 and stacked die 102 so as to implement the scan chain.

Embodiments of the present invention include probe pads 141-144 that are disposed on the face side of base die 101. A first probe pad, test input probe pad 141, is configured to couple test input. A second probe pad, test output probe pad 142, is configured to couple test output. A third probe pad, test control probe pad 143, is configured to couple control signals. Additional probe pads such as exemplary probe pad 144 can couple other test-related signals to base die 101 and stacked die 102.

In the present embodiment integrated circuit device 100 is packaged using a package substrate 150 that includes contacts 109 that correspond to contacts 106. Contacts 106 and 109 can be corresponding grid arrays of contact pads that are coupled together by solder balls. Contact pads 106-109 couple base die 101, stacked die 102 and package substrate 150 together so as to allow for normal operation of integrated circuit device 100.

FIG. 1 is shown to include contacts 107 on the back side of base die 101 that couple to corresponding microbumps. However, it is appreciated that, alternatively, microbumps can couple directly to through-die vias 121-128, eliminating the need for contacts 107.

Figure 2:
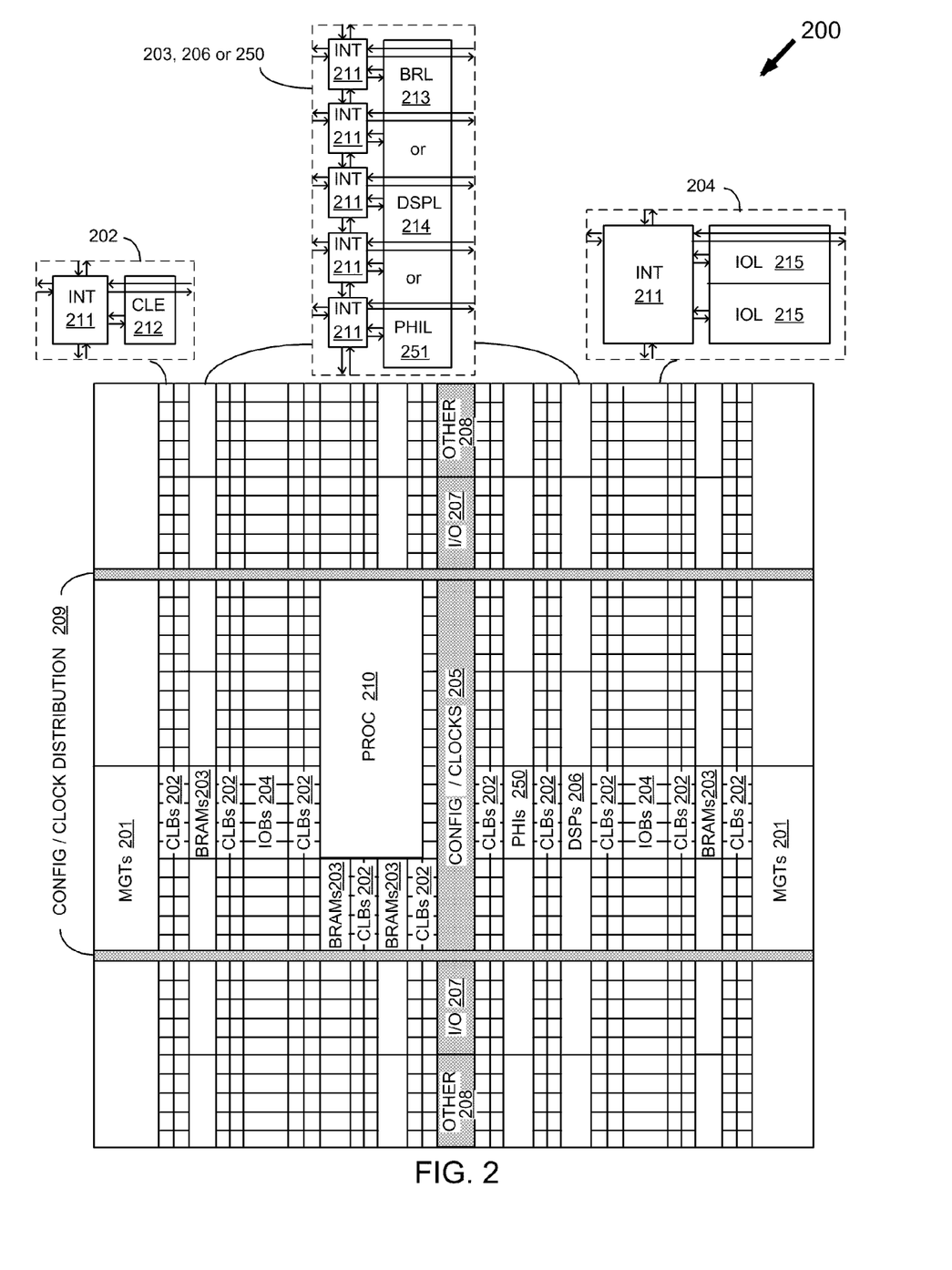
FIG. 2 is a block diagram depicting an exemplary field programmable gate array architecture in accordance with an embodiment of the invention.

In one embodiment that is shown in FIG. 2 base die 101 is a FPGA die having a FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as five CLBs, but other numbers (e.g., six) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

FPGA 200 also includes one or more interface tiles 250 arranged in a column. In the present embodiment interface tiles 250, that can be referred to as programmable heterogeneous integration tiles (PHI) tiles, are operable for interconnection to one or more other integrated circuit die stacked on the back side of the die of FPGA 200. In the embodiment shown, FPGA architecture 200 includes a single column of interface tiles 250. Although only a single column of interface tiles 250 is shown, it is to be understood that FPGA architecture 200 may generally include one or more columns of interface tiles 250. In other embodiments FPGA 200 may include less than an en entire column of interface tiles 250.

In the present embodiment each interface tile 250 includes a programmable logic element 251, that can be referred to hereinafter as a programmable heterogeneous logic element (PHIL), in addition to an appropriate number of programmable interconnect elements.

Figure 3:
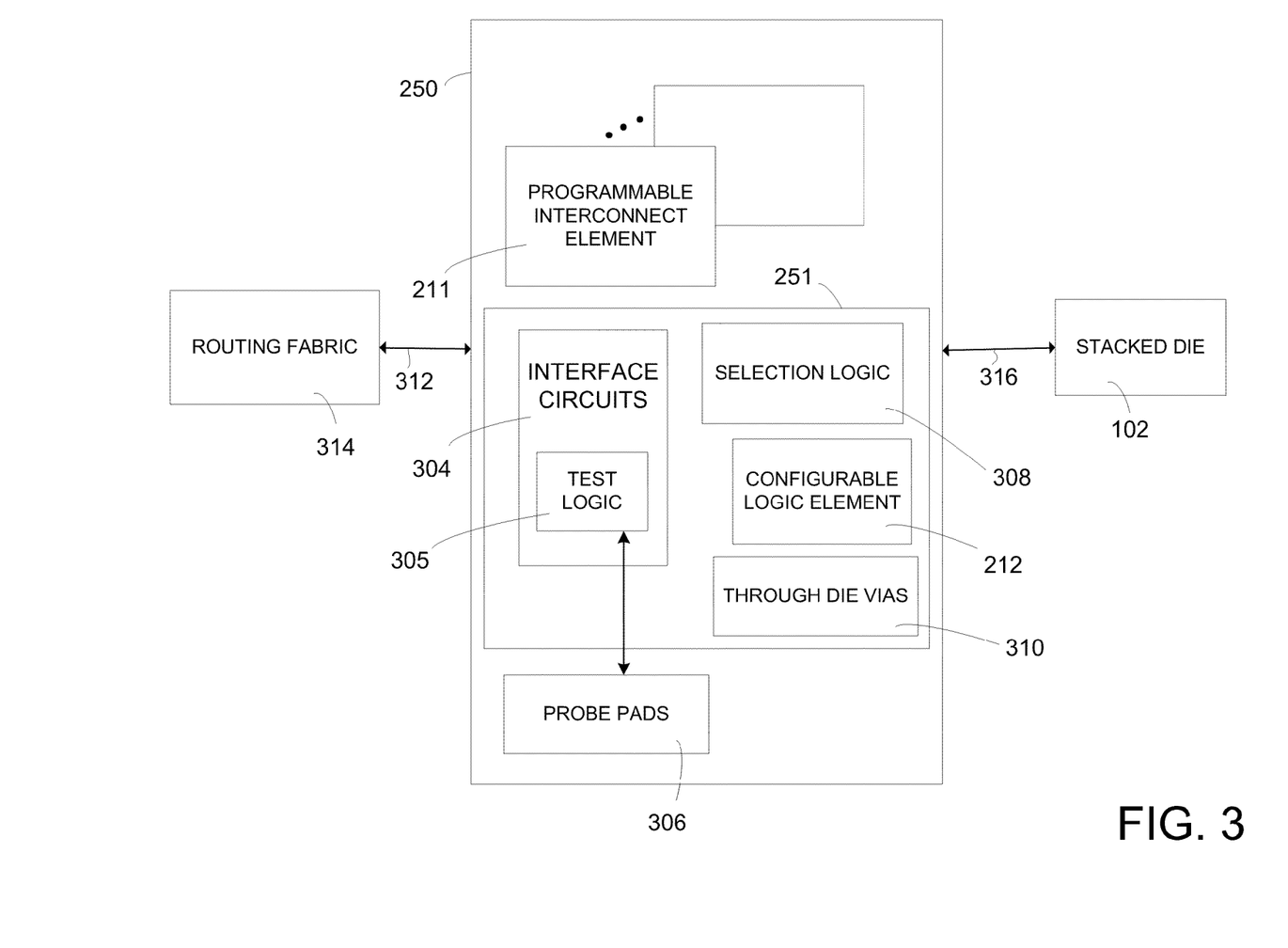
FIG. 3 is a block diagram depicting an interface tile in accordance with an embodiment of the invention.

In the embodiment shown in FIG. 3, an exemplary interface tile 250 is shown that includes one or more programmable interconnect elements 211 and a programmable logic element 251 that includes configurable logic element 212, interface circuits 304, selection logic 308, and a plurality of through-die vias 310. Interface tile 250 includes an interface 312 to routing fabric 314 of the FPGA. The interface 312 includes various routing conductor segments that form part of the FPGA routing fabric 314. Interface tile 250 includes an interface 316 with stacked die 102 that can include, for example, contacts 107 that are electrically coupled to conductive interconnect of the stacked die 102 using micro-bumps in the manner shown in FIG. 1.

Each of the programmable interconnect elements 211 includes programmable multiplexing structures that couple the interface tile 250 to the routing conductor segments of interface 312. Configurable logic element 212 includes one or more slices of logic having lookup tables (LUTs), multiplexers, flip-flops, and the like.

Interface circuits 304 facilitate communication between the FPGA routing fabric 314 and stacked die 102 through the through-die vias 310. In one embodiment through-die vias 310 include through-die vias 121-128 and interface circuits 316 include contacts 107. Selection logic 308 is configured to selectively change the function of interface tile 250 between the functionality of a programmable logic tile (e.g., a CLB) and an interface function. In the present embodiment the interface function operably couples integrated circuit die 102 to routing fabric 314. For example, selection logic 308 may be configured such that signals received from FPGA routing fabric 314 are coupled to configurable logic element 212, and signals produced by configurable logic element 212 are coupled to FPGA routing fabric 314. In other words, selection logic 308 causes interface tile 250 to operate similar to a CLB tile (e.g., CLB 202). Alternatively, selection logic 308 may be configured such that signals received from FPGA routing fabric 314 are coupled to stacked die 102 (through interface circuits 304 and through-die vias 310) and signals produced by stacked die 102 are coupled to FPGA routing fabric 314 (through interface circuits 304 and through-die vias 310). In other words, selection logic 308 cause interface tile 250 to operate as an interface between FPGA routing fabric 314 and stacked die 102. The function of interface tile 250 as implemented by selection logic 308 may be controlled by the configuration of memory cells of the FPGA (not shown) or by a control signal either external to or internal to interface tile 250.

In some embodiments, interface circuits 304 provide voltage level translation. In some cases interface tile 250 and the FPGA may operate using a different supply voltage than stacked die 102. In this embodiment interface circuits 304 translate the voltage of signals originating from FPGA routing fabric 314 and destined for stacked die 102 to the voltage required by stacked die 102. Likewise, interface circuits 304 translate the voltage of signals originating from stacked die 102 and destined for FPGA routing fabric 314 to the voltage required by the FPGA. In some embodiments, interface circuits 304 also provide for registering of signals coupled from FPGA routing fabric 314 to stacked die 102, and signals coupled from stacked die 102 to FPGA routing fabric 314.

Continuing with FIG. 3 interface circuit 304 includes test logic 305. In addition, interface tile 250 includes probe pads 306 that directly couple to test logic 305. In one embodiment each of probe pads 306 are connected to one or more wiring segment that connects to circuitry of test logic 305. By directly coupling probe pads 306 to test logic 305, signals coupled through probe pads 306 do not have to pass through the FPGA routing fabric. Accordingly, configuration is not required to be performed in order to couple signals to test logic 305 to form a scan chain for testing the integrated circuit device.

In one embodiment all of probe pads 306 are on the back side of the integrated circuit device (e.g., contact pads 111-116 of FIG. 1). This embodiment allows for testing of the integrated circuit device by coupling a testing device to the back side of the wafer such that it couples to probe pads 306, allowing for easily testing the connections between the base die and the stacked die prior to singulation of the base die and without requiring configuration of the programmable logic of interface tile 250 or routing fabric 314.

In another embodiment all of probe pads 306 are on the face side of the integrated circuit device (e.g., contact pads 141-144 of FIG. 1). This embodiment allows for testing of the integrated circuit device by coupling a testing device to the front side of the wafer such that it couples to probe pads 306, allowing for easily testing the connections between the base die and the stacked die prior to singulation of the base die without requiring configuration of the programmable logic of interface tile 250 or routing fabric 314.

In yet another embodiment probe pads 306 include a first set of probe pads on the back side of the integrated circuit device (e.g., probe pads 111-116 of FIG. 1) and a second set of probe pads disposed on the front side of the integrated circuit device (e.g., probe pads 141-144 of FIG. 1). Both sets of probe pads are directly coupled to test logic 305. This allows for testing of the integrated circuit device by coupling a testing device to either the back side of the wafer or the front side of the wafer. Thereby, testing can be easily accomplished by attaching the testing device to whichever side of the wafer that is most easily accessible at the time that testing is to be performed. This allows for testing without the need to flip over the wafer in order to access the probe pads 306.

In some embodiments some of probe pads 306 couple to test logic 305 through through-die vias 310. More particularly, an individual probe pad 306 can connect to one or more wiring segment that connects to one end of a through-die via 310 and the other end of the through-die via 310 can connect to one or more wiring segment that connects to circuitry of test logic 305.

In one embodiment probe pads 306 are disposed on the back side of the integrated circuit device and the through-die vias 310 include a first set of through-die vias and a second set of through-die vias. The first set of through-die vias (e.g., through-die vias 121-128) couple signals between the programmable circuitry and the stacked die during normal operation of the integrated circuit device. The second set of through-die vias (e.g., through-die vias 131-133) are dedicated to testing and couple one or more of the probe pads 306 to test logic 305.

Figure 4:
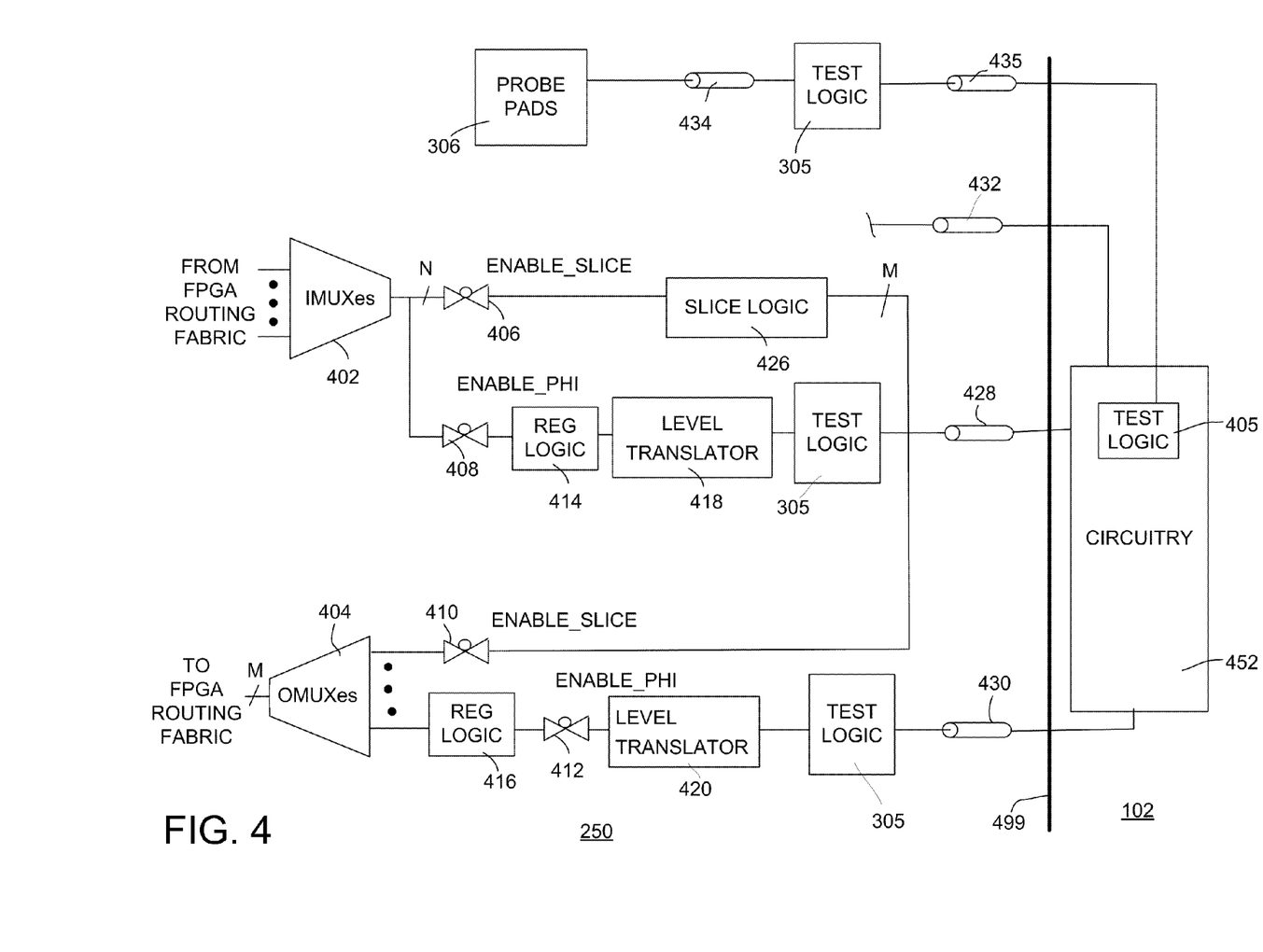
FIG. 4 is a block diagram depicting a more detailed embodiment of an interface tile that illustrates the connections between the interface tile and a stacked die in accordance an embodiment of the invention.

FIG. 4 shows an exemplary interface tile 250 that includes a first set of vias 428-432 that couple interface tile 250 to stacked die 102 during normal operation of stacked die 102 and includes a second set of through-die vias 434-435 that are dedicated to testing. In this embodiment a set of vias, represented by exemplary via 435 couple test logic 305 to corresponding test logic 405 and a different set of vias, represented by exemplary via 434 couple to probe pads 306 for connecting probe pads 306 directly to test logic 305.

Continuing with FIG. 4, interface tile 250 also includes input multiplexing logic (IMUXes 402), output multiplexing logic (OMUXes 404), three-state buffers 406, 408, 410, and 412, register logic 414 and 416, level-translation circuits 418 and 420, test logic 305, slice logic 426, and Through-die vias 428, 430 and 432. With respect to FIG. 3, three-state buffers 406 through 412 comprise selection logic 308; register logic 414-416, level-translation circuit 418-420, and test logic 305 comprise interface circuits 304; the IMUXes 402 and OMUXes 404 comprise the programmable interconnect elements 211; and the slice logic 426 comprises the configurable logic element 312.

Inputs of IMUXes 402 are coupled to FPGA routing fabric 314. An output of IMUXes 402 is coupled to inputs of three-state buffers 406 and 408, respectively. The output of the IMUXes 402 illustratively includes N terminals, where N is an integer greater than zero (i.e., IMUXes 402 include N multiplexers). IMUXes 402 are configured to couple selected routing conductors of the FPGA routing fabric to three-state buffers 406 and 408.

An output of three-state buffer 406 is coupled to an input of slice logic 426. Slice logic 426 includes a plurality of slices. Each of the slices includes various logic elements, including LUTs, flip-flops, combinatorial logic, and the like. An output of three-state buffer 408 is coupled to an input of register logic 414. Register logic 414 includes a plurality of registers (e.g., flip-flops). For example, register logic 414 may include N flip-flops, one for each terminal of the output of IMUXes 402.

A control input of three-state buffer 406 is configured to receive an enable_slice signal. A control input of three-state buffer 408 is configured to receive an enable_PHI signal. The enable_slice and enable_PHI signals may be generated externally to interface tile 250 or may be set by configuration memory cells. If the enable_slice signal is active, the outputs of IMUXes 402 are coupled to the slice logic 426. If the enable_slice signal is inactive, three-state buffer 406 provides a high-impedance output for slice logic 426. Likewise, if the enable_PHI signal is active, the outputs of IMUXes 402 are coupled to register logic 414. If the enable_PHI signal is inactive, three-state buffer 408 provides a high-impedance output for register logic 414. In this manner, the enable_slice and enable_PHI signals control whether IMUXes 402 drive slice logic 426 and/or register logic 414. In one embodiment, three-state buffers 406 and 408 are configured such that IMUXes 402 drive either slice logic 426 or register logic 414.

An output of slice logic 426 is coupled to an input of three-state buffer 410. The output of slice logic 426 is illustratively shown as having M terminals, where M is an integer greater than zero. An output of three-state buffer 410 is coupled to inputs of OMUXes 404. OMUXes 404 include M multiplexers. An output of three-state buffer 412 is coupled to an input of register logic 416. An output of register logic 416 is coupled to the inputs of OMUXes 404. Register logic 416 includes a plurality of registers (e.g., flip-flops). For example, register logic 416 may include M flip-flops. A control input of three-state buffer 410 is configured to receive the enable_slice signal. A control input of three-state buffer 412 is configured to receive the enable_PHI signal. Three-state buffers 410 and 412 operate in a manner similar to three-state buffers 406 and 408. An output of OMUXes 404 is coupled to FPGA routing fabric 314.

Using three-state buffers 406-412, interface tile 250 may function as a CLB or as an interface tile for interfacing stacked die 102. Three-state buffers 406 and 410 may be active, causing input signals to pass from IMUXes 402 through slice logic 426, and output signals to pass from slice logic 426 to OMUXes 404. Alternatively, three-state buffers 408 and 412 may be active, causing input signals to pass from IMUXes 402 through register logic 414, level-translation circuit 418, test logic 305, and through-die vias 428 to circuitry 452 on stacked die 102, and output signals to pass through through-die vias 430, test logic 305, level-translation circuit 420, and register logic 416 to the OMUXes 404.

An output of register logic 414 is coupled to an input of the level-translation circuit 418. An output of level translation circuit 418 is coupled through test logic 305 to through-die vias 428. Through-die vias 428 are electrically coupled to circuitry 452 in stacked die 102. Stacked die 102 is electrically and mechanically coupled to the back side of the die of the FPGA die that includes interface tile 250. In the present embodiment through-die vias 434 and 435 are part of interface tile 250. However, alternatively, through-die vias 434 and 435 may be located externally to the interface tile 250. A line 499 demarcates the boundary between the FPGA die that includes interface tile 250 and stacked die 102.

One input of the level-translation circuit 418 is configured to receive a supply voltage VDD2. Assume the FPGA (and hence the interface tile 250) operates using the voltage supply VDD1, and the circuitry 452 of stacked die 102 operates using the voltage supply VDD2. The level-translation circuit 418 is configured to translate the voltage of signals received from the register logic 414 from VDD1 to VDD2. This allows the signals provided by the register logic 414 to properly drive the circuitry 452. Another input of the level-translation circuit 420 is configured to receive the supply voltage VDD1. Level-translation circuit 420 is configured to translate the voltage of signals received from the circuitry 452 in second die 218 from VDD2 to VDD1. This allows the signals provided by second die 218 to properly drive circuitry in the FPGA that uses the VDD1 supply voltage.

In the present example, through-die vias 428 include N through-die vias for providing N signals to circuitry 452 in stacked die 102. In the present embodiment through-die vias 430 include M through-die vias for receiving M signals from the circuitry 452 in the stacked die 102. Through-die vias 430 are electrically and mechanically coupled to the back side of the FPGA die that includes interface tile 250. An input of level-translation circuit 420 is electrically coupled to through-die vias 430. An output of level translation circuit 420 is coupled to an input of three-state buffer 412.

Figure 5:
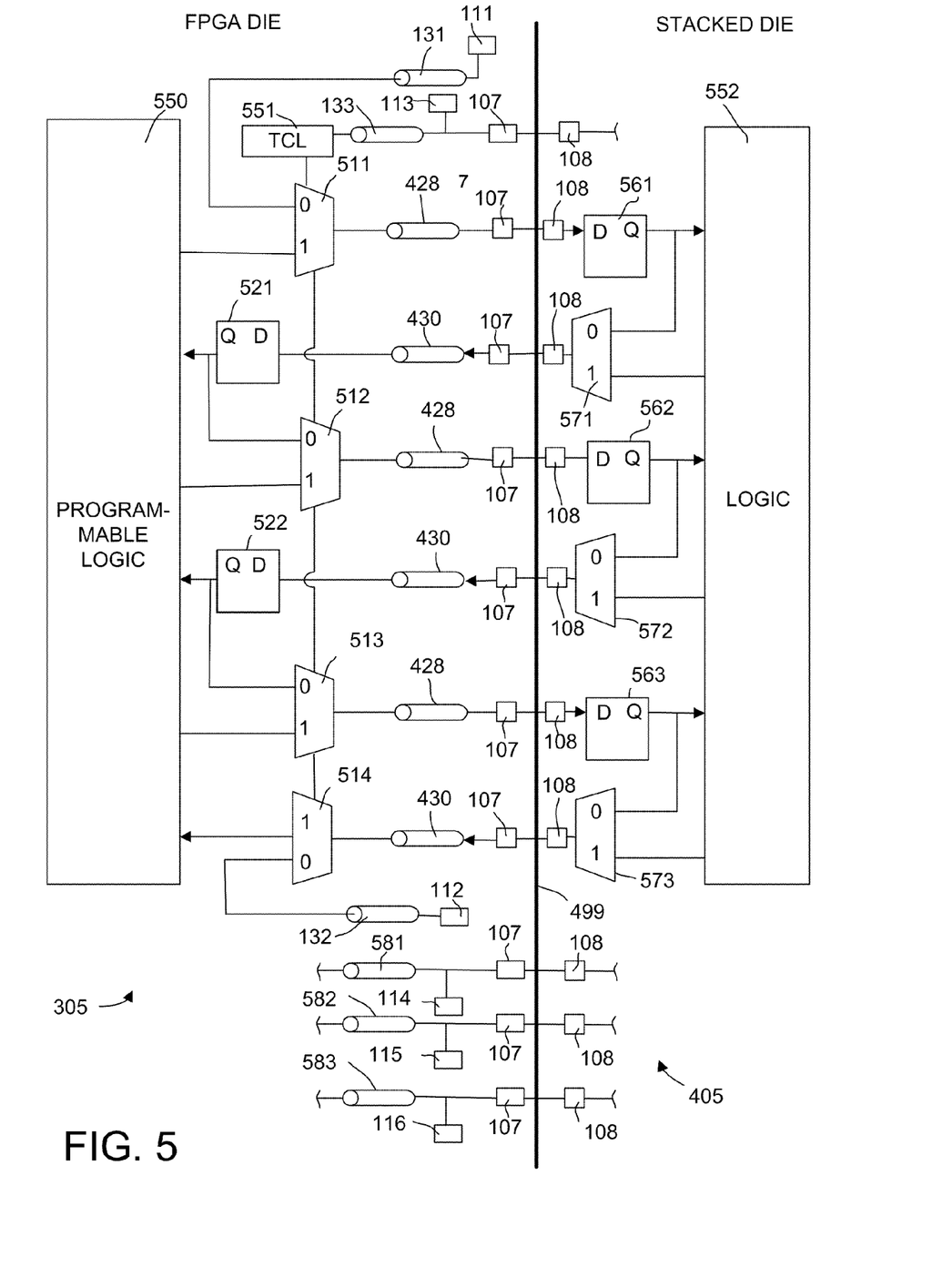
FIG. 5 is a block diagram depicting an embodiment in which probe pads that are located on the back side of the base die couple input and output to test logic of the base die and corresponding test logic of the stacked die in accordance with an embodiment of the invention.

FIG. 5 is a block diagram depicting an exemplary embodiment of test logic 305 and 405 in accordance with one or more aspects of the invention. A line 499 demarcates the boundary between base die 101 and stacked die 102. In the present example, base die 101 is a FPGA die that includes programmable logic 550. In the embodiment shown in FIG. 3 programmable logic 550 includes programmable interconnect elements 211 and FPGA routing fabric 314. In the embodiment shown in FIG. 2 programmable logic 550 includes some or all of the features of FPGA architecture 200. Programmable logic 550 in the FPGA die is coupled to the logic 552 of stacked die 102 through contact pads 107-108.

Test logic 305 includes a plurality of multiplexers, represented by exemplary multiplexers 511-514, with each of the multiplexers 511-514 electrically coupled to the third through-die via 133 for receiving the control signals. Each of multiplexers 511-514 is coupled to one of through-die vias 428-430.

Test logic 305 includes a plurality of registers, represented by exemplary registers 521-522. Each of registers 521-522 includes an input that is coupled to one of through-die vias 430 and each of registers 521-522 includes an output that is coupled to an input of one of multiplexers 512-513 and to programmable logic 550. In the present embodiment, a first multiplexer 511 has an input that is coupled to through-die via 131, an input that is coupled to programmable logic 550 and an output that is coupled to a through-die via 428. A second multiplexer 514 has an output that is coupled to through-die via 132, an output that is coupled to programmable logic 550 and an input that is coupled to a through-die via 430. Additional multiplexer 512 has an input that is coupled to an output of register 521, has an input that is coupled to logic 550 and has an output that is coupled to a through-die via 428. Similarly, additional multiplexer 513 has an input that is coupled to an output of registers 522, has an input that is coupled to logic 550 and has an output that is coupled to a through-die via 428.

Continuing with FIG. 5, test logic 405 includes registers 561-563 and multiplexers 571-573. Each of registers 561-563 includes an input that is coupled to a through-die via 428, and each of registers 561-563 includes an output that is coupled to an input of one of multiplexers 571-573 and to logic 552. Multiplexers 571-573 each have an input coupled to logic 552 and an output that couples to a through-die via 430 through contacts 107-108.

In the present embodiment each of registers 521-522 and 561-563 comprises a single flip-flop. However, it is appreciated that other configurations of registers 521-522 and 561-563 could also be used. In addition, though FIG. 5 shows two additional multiplexers 512-513 and two registers 521-522, other embodiments of the present invention will include many more sets of registers 521-522 and multiplexers 512-513. Moreover, each base die 101 may include any number of sets of probe pads 111-113, through-die vias 131-133 that implement individual scan chains. In one embodiment each programmable logic element 251 includes a scan chain. Alternatively, every other adjoining interface tile includes a set of probe pads 111-113 and through-die vas 131-133 such that each pair of adjoining interface tiles forms a scan chain. In yet another embodiment every third interface tile includes a set of probe pads 111-113 and through-die vias 131-133 such that each set of three adjoining interface tiles forms a scan chain. In addition, every fourth, fifth, sixth, etc. interface tile can include of probe pads 111-113 and through-die vias 131-133 such that a scan chain is formed having a desired size. In one embodiment each base die 101 includes multiple scan chains, some of which have different numbers of probe pads so as to accommodate stacked die 102 having different sizes and connection requirements. In one embodiment test control logic 551 includes logic for forming scan chains that span multiple CLE's such that any number of programmable logic elements can be tested.

In one embodiment, in addition to probe pads 111-113, test logic 305 includes probe pads 114-116 and through-die vias 581-583 for providing other input to base die 101 and stacked die 102. Clock signal probe pad 114 connects to through-die via 581 which is coupled to each of multiplexers 511-514 and electrically coupled to each of registers 521-522 for clocking the circuitry of test logic 305 and 405. Power probe pad 115 receives a power signal and ground probe pad 116 receives a ground signal for operation of test logic 305 and 405. In one embodiment through-die vias 581-583 are dedicated to testing and are located under contacts 114-116. Alternatively, contacts 114-116 can couple to through-die vias in through-die vias 121-128 that couple clock, power and ground signals to stacked die 102 during normal operation of stacked die 102.

Figure 6:
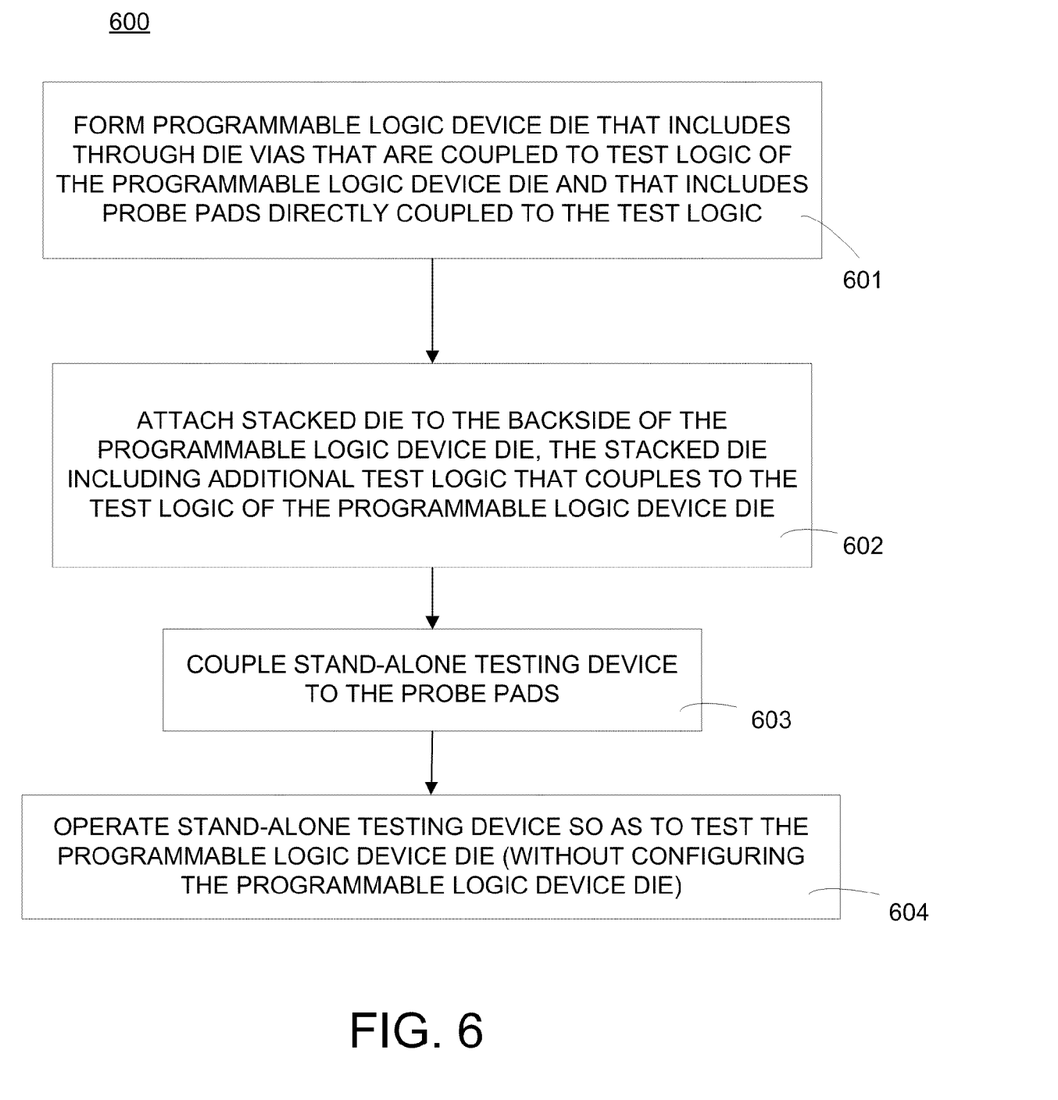
FIG. 6 is a diagram depicting a method for testing a stacked-die assembly in accordance with an embodiment of the invention.

FIG. 6 illustrates a method for testing in accordance with an embodiment of the present invention. Referring now to step 601, a programmable logic device die is formed that includes a set of through-die vias coupled to test logic of the programmable logic device die and a plurality of probe pads directly coupled to the test logic. In the present embodiment, a plurality of programmable logic device die are formed on a semiconductor wafer using conventional via-last semiconductor fabrication processes, with each programmable logic device die including programmable logic, through-die vias, contacts and probe pads.

In one embodiment step 601 is performed using conventional semiconductor fabrication processes in which multiple die are formed on each semiconductor wafer, with each die including logic that forms a programmable logic device and test logic. In one embodiment a conventional via-last fabrication process is used in which the through-die vias are formed, the back side of the wafer is polished to reduce the thickness of the wafer and expose the through-die vias, followed by deposition and patterning of a layer of conductive material (e.g., metal) so as to form the probe pads and contact pads on the back side of the die.

As shown by step 602 a stacked die is attached to the back side of the programmable logic device die, the stacked die including additional test logic that couples to the test logic of the programmable logic device die. In the present embodiment the programmable logic device die is a FPGA die and the stacked die is coupled to the programmable logic device die in the manner shown in FIG. 1.

Referring now to step 603, a stand-alone testing device is coupled to the plurality of probe pads. In one embodiment the stand-alone testing device is a computer that is electrically coupled to a test fixture that includes probes that contact each probe pad.

As shown by step 604 the stand-alone testing device is operated so as to test the programmable logic device die. In the present embodiment, the logic of the programmable logic device is not configured prior to operating the stand-alone testing device in step 604. This saves significant time and expense as compared to testing methods in which the programmable logic device must be configured prior to testing.

In one embodiment the programmable logic device die is a field programmable gate array (FPGA) and step 604 further includes sending control signals from the stand-alone testing device to a third probe pad, sending test data from the stand-alone testing device to a first probe pad, sending test output from the second probe pad to the stand-alone testing device, and analyzing the test output at the stand-alone testing device to identify defects in the programmable logic device.

In the present embodiment step 604 is performed on the semiconductor wafer prior to singulation of the semiconductor wafer. Thereby the manufacturer can determine whether or not each programmable logic device die is good prior to die singulation.

In one embodiment step 601 only forms the probe pads on the back side of the programmable logic device die. In this embodiment step 602 is performed by coupling the testing device to the back side of the semiconductor wafer such that it couples to each of the probe pads. The testing of step 603 is then performed in its entirety, using only the probe pads on the back side of the programmable logic device die, prior to singulation of the programmable logic device die. For example, in the embodiment shown in FIG. 5, the stand alone testing device couples to probe pads 111-116 and sends a control signal to probe pad 113 that causes the test control logic 551 to provide input to multiplexers 511-514 which starts a "test mode" in which a scan chain is formed. In one specific embodiment test control logic 551 includes circuitry that is operable to perform a Boolean operation between the control signal and a configuration memory signal to determine the state of each multiplexer 511-514 and send the appropriate control signal to each multiplexer 511-514. Either test control logic 551 or corresponding test control logic on stacked die 102 is operable to provide corresponding control input to multiplexers 571-573. In one embodiment a logical "0" control signal is sent to multiplexers 511-514 and 571-573 such that multiplexer 511 selects input from probe pad 111, multiplexer 571 selects input from register 561, multiplexer 512 selects input from register 521, multiplexer 572 selects input from register 562, multiplexer 513 selects input from register 521, multiplexer 573 selects input from register 563, and multiplexer 514 selects output to probe pad 112. Thereby, output is generated at probe pad 112 that is coupled to the stand alone testing device.

The ability to test the through-die vias and the other components of the interface between base die 101 and stacked die 102 from the back side of the wafer is particularly useful in embodiments in which the thinning of the wafer requires the use of a supporting "handling wafer" that prevents access to the front side of the wafer for test purposes. In one specific embodiment, the semiconductor wafer is supported by a handle wafer during the wafer thinning process and the FPGA wafer remains supported by the handling wafer throughout steps 602-604 such that testing is accomplished without having to separate the FPGA wafer from the handling wafer.

Figure 7:
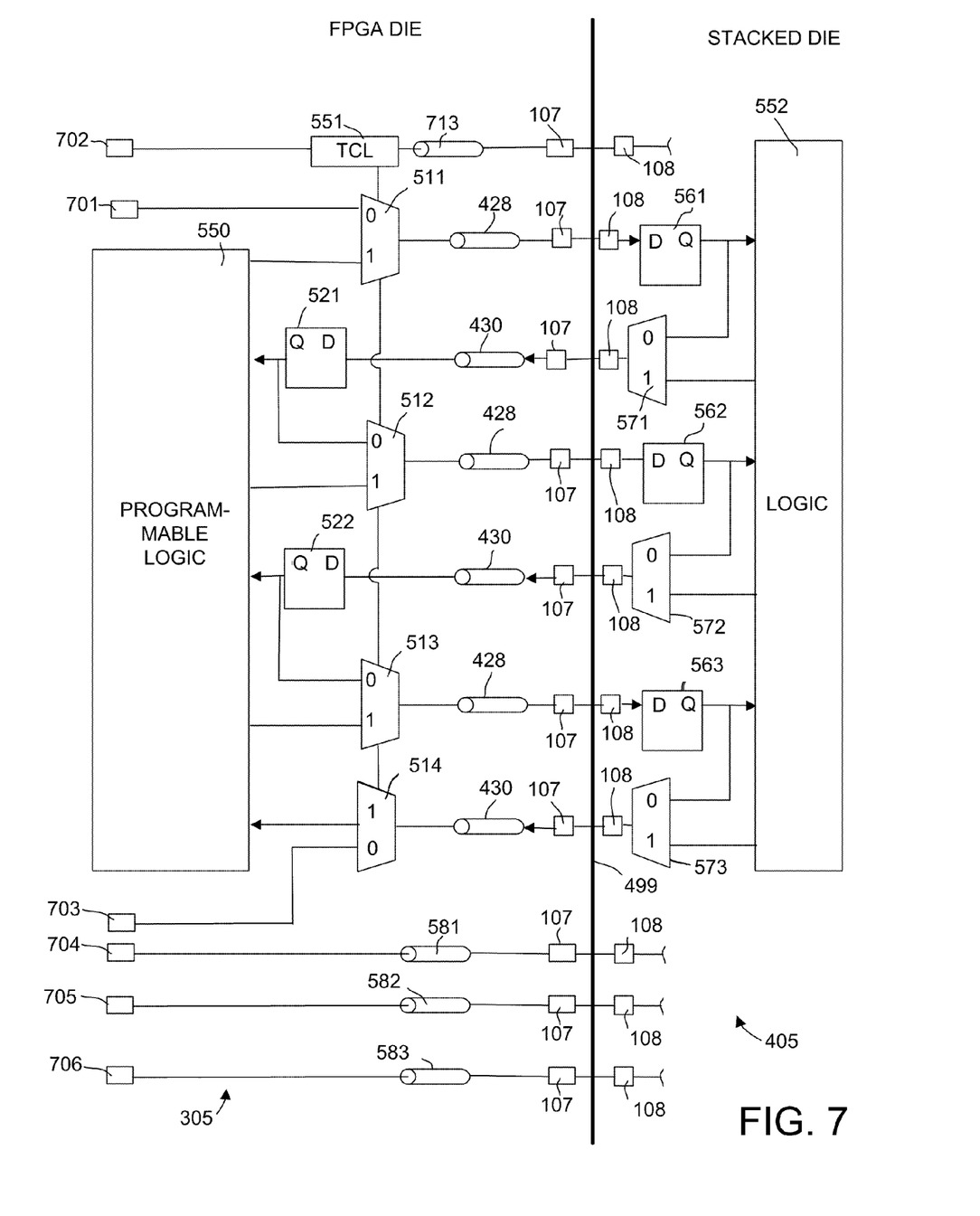
FIG. 7 is a block diagram depicting an embodiment in which probe pads that are located on the face side of the base die couple to test logic of the base die in accordance with an embodiment of the invention.

In another embodiment that is illustrated in FIG. 7, step 601 only forms probe pads on the front side of the programmable logic device die. In this embodiment step 602 is performed by coupling the testing device to the front side of the semiconductor wafer such that it couples to each of the probe pads. The testing of step 603 is then performed in its entirety, using only the probe pads on the front side of the programmable logic device die, prior to singulation of the programmable logic device die. For example, in one embodiment base die 101 of FIG. 1 includes only probe pads 141-144 and does not include probe pads 111-116 on the back side on base die 101. In this embodiment test signals are coupled to test logic 305 through probe pads 701-706. In one embodiment probe pad 701 is probe pad 141, probe pad 702 is probe pad 142, probe pad 703 is probe pad 143 and probe pads 704-706 are identical to probe pad 144, where all of probe pads 701-706 are dedicated to testing and are not used during normal operation of base die 101 and stacked die 102. Through-die via 713 couples to test control logic and to probe pad 702 for receiving control signals that control the operation of multiplexers 511-514 and 571-573 and that couple to test logic 405 through a contact pad 107. Probe pad 701 couples test input, probe pad 703 couples to the output of multiplexer 514 to provide test output. Probe pad 704 couples a clock signal to registers 521-522, to test control logic 551 and to multiplexers 511-514. Probe pad 705 receives a power signal and probe pad 705 receives a ground signal for operation of test logic 305 and 405. In the present embodiment probe pads 701-706 and through-die vias 713 and 581-583 are dedicated to testing and therefore, do not couple signals to stacked die 102 during normal operation of stacked die 102.

When the embodiment shown in FIG. 7 is used to perform method 600, the stand alone testing device couples to probe pads 701-706 and sends a control signal to probe pad 702 that causes the test control logic 551 to provide input to multiplexers 511-514 which starts a "test mode" in which a scan chain is formed. Either test control logic 551 or corresponding test control logic on stacked die 102 is operable to provide corresponding input to multiplexers 571-573. In the present embodiment a logical "0" control signal is sent to multiplexers 511-514 and 571-573 such that multiplexer 511 selects input from probe pad 701, multiplexer 571 selects input from register 561, multiplexer 512 selects input from register 521, multiplexer 572 selects input from register 562, multiplexer 513 selects input from register 522, multiplexer 573 selects input from register 563, and multiplexer 514 selects output to probe pad 703. Thereby, output is generated at probe pad 703 that is coupled to the stand alone testing device.

In one alternate embodiment, probe pads 704-706 couple to the through-die vias 121-128 that couple clock, power and ground signals to stacked die 102 during normal operation of stacked die 102, eliminating the need for additional through-die vias 581-583 that are dedicated to testing. Moreover, in another alternate embodiment probe pads 704-706 include one or more of contact pads 106. For example, probe pad 704 can be a contact pad 106 that couples clock signals to stacked die 102 during normal operation; contact pad 705 can be a contact pad 106 that couples a power signal to base die 101 and/or stacked die 102 during normal operation; and contact pad 706 can be a contact pad 106 that couples a ground signal to base die 101 and/or stacked die 102 during normal operation.

Figure 8:
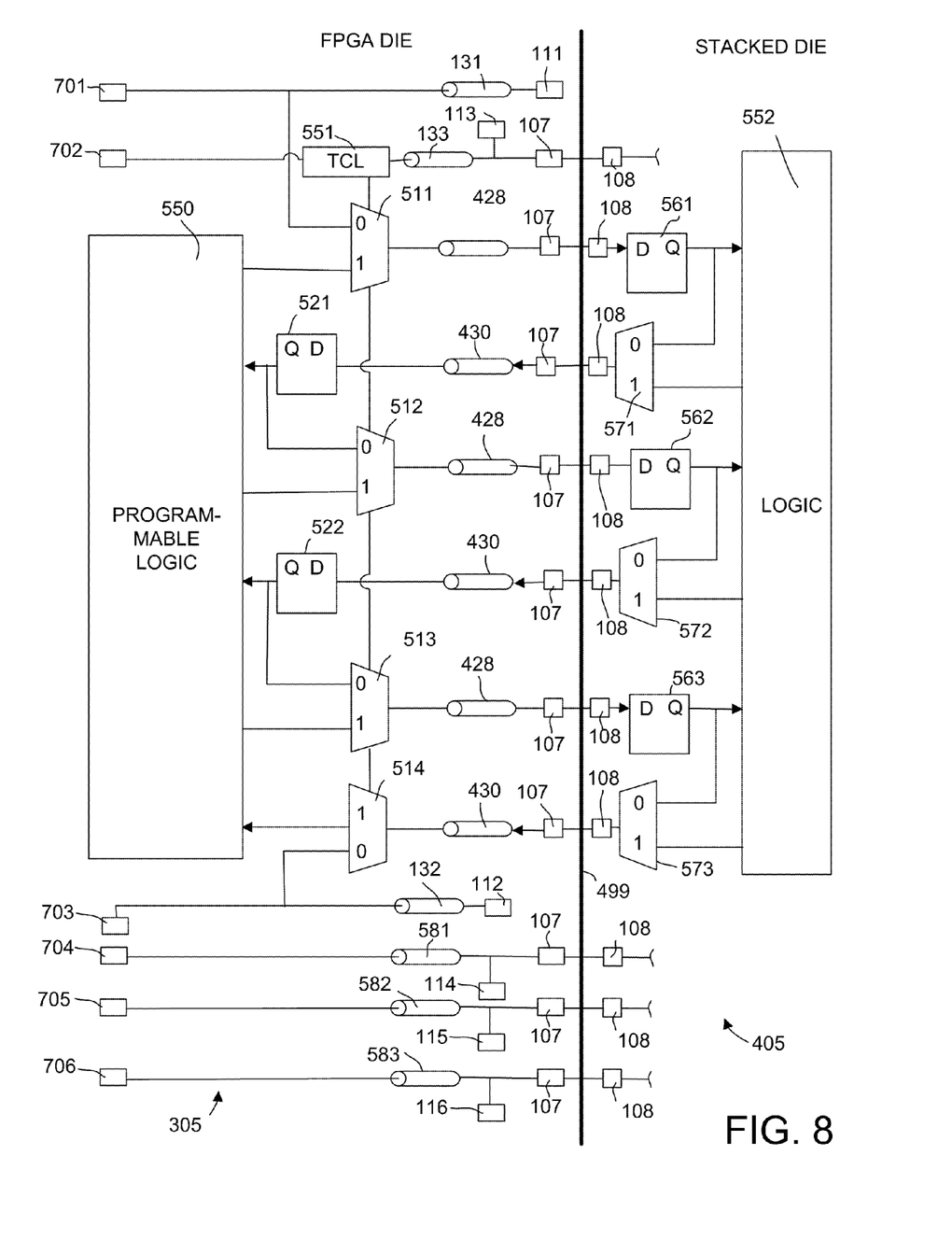
FIG. 8 is a block diagram depicting an embodiment in which probe pads are located both on the back side of the base die and on the face side of the base die in accordance with an embodiment of the invention.

In another embodiment that is illustrated in FIG. 8, step 601 forms two sets of probe pads, a first set on the back side and a second set on the front side of the programmable logic device. In this embodiment step 602 can be performed either by coupling the testing device exclusively to probe pads 111-116 on the back side of base die 101 or by coupling the stand-alone testing device exclusively to probe pads 701-706 on the front side of the base die. In the present embodiment test logic 305 combines the features of the test logic shown in FIGS. 5 and 7, with testing from the back side performed in the same manner as discussed with reference to FIG. 5 and testing from the face side performed in the same manner as discussed with reference to FIG. 7. This allows for testing by coupling to whichever side of the wafer that is accessible at the time that testing is performed. Thereby, there is no need to remove the wafer from the wafer carrier or flip the wafer in order to perform the testing.

Continuing with FIG. 8, during normal operation ("normal mode") a logical "1" is selected such that each multiplexer 511-513 in FIGS. 5-8 selects input from programmable logic 550, each multiplexer 571-573 selects input from logic 552 and multiplexer 514 selects output to programmable logic 550.

Figure 9:
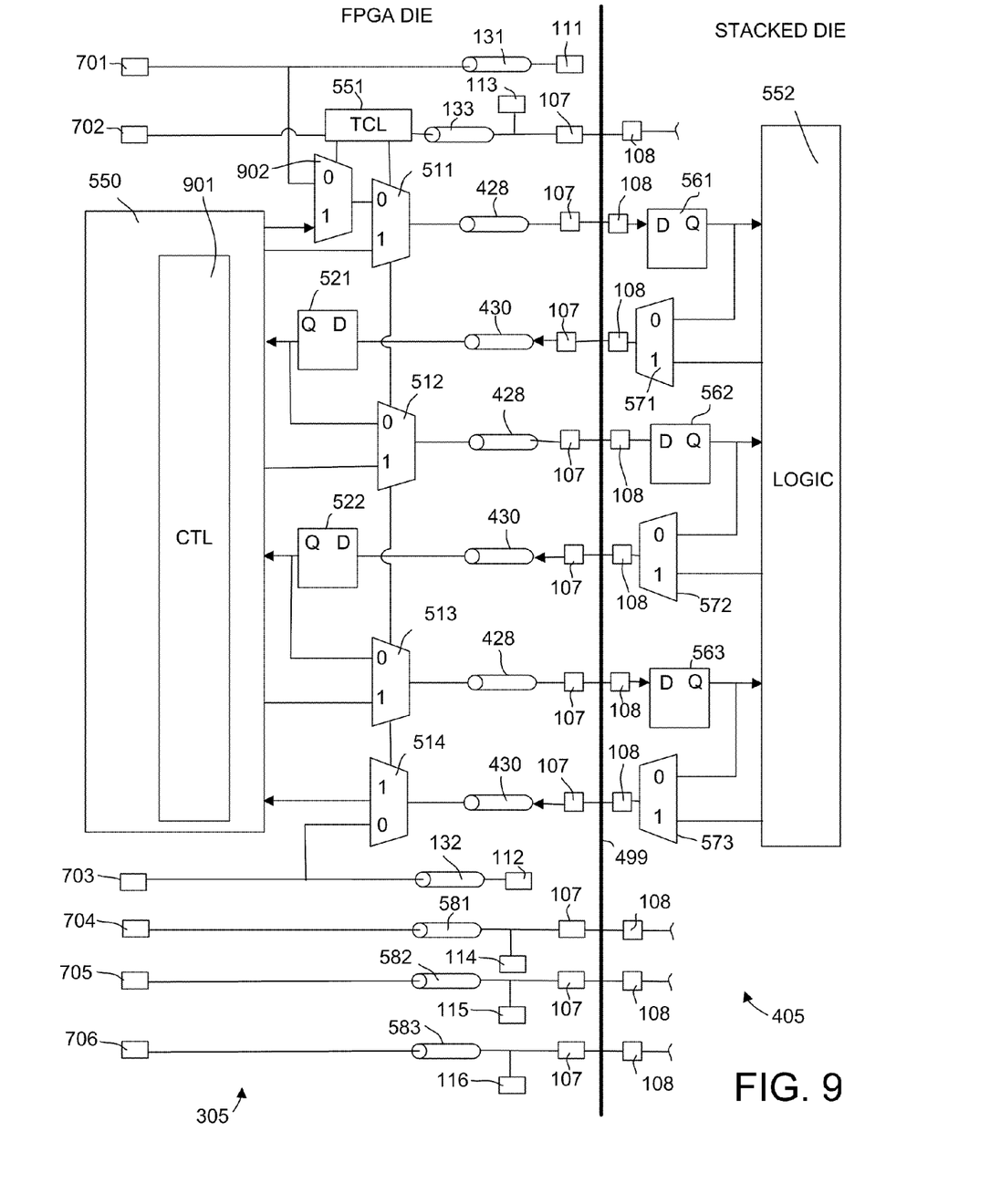
FIG. 9 is a block diagram depicting an embodiment in which probe pads are located both on the back side of the base die and on the face side of the base die, and in which configurable test logic can be used to perform testing in accordance with an embodiment of the invention.

In one embodiment that is illustrated in FIG. 9, the "normal mode" also includes a normal test mode that can be obtained by configuring configurable logic to provide a scan chain, where test signals are coupled through configurable logic 550.

Continuing with FIG. 9, test control logic 305 includes a multiplexer 902 that includes an input that is coupled to contact pad 701 and contact pad 111, a second input that is coupled to configurable logic 550, and an output that is coupled to an input of multiplexer 511. In this embodiment configurable logic 550 is configured (e.g., by loading a bitstream of configuration data) to include control test logic 901 that couples input to multiplexer 902 and output from multiplexer 514 to contacts 106 so as to allow for testing during normal operation. In one embodiment, a logical 1 is provided to multiplexers 511 and 514, and a logical 0 is provided to multiplexers 512-513 and 571-573 to form a scan chain that receives test input coupled through programmable logic 550 and provides test output through programmable logic 550. Accordingly test signals are not coupled through probe pads 111-116 or 141-144 as in previous embodiments, but are coupled through the programmed portion of configurable logic 550 that forms control test logic 901. In one embodiment control test logic 901 is programmed such that the scan chain conforms to a Joint Test Action Group (JTAG) standard for testing using signals coupled through contact pads 106 and 109 after configuration of base die 101 so as to propagate the test signals through package substrate 150, base die 101 and stacked die 102.

The embodiment shown in FIG. 9 allows for use of test logic 305 to perform conventional testing using contacts 106 that are operable in the normal operating mode of base die 101. In addition, testing can be performed prior to configuration of the base die using probe pads 111-116 on the back side of base die 101, and testing can be performed prior to configuration using probe pads 701-706 on the front side of base die 101.

Thus, the method and apparatus of the present invention allow for quickly and effectively testing the interconnect structures that couple the stacked die to the base die. In particular, the manufacturer can quickly and easily identify misaligned stacked die, missing or misaligned solder bumps, missing or misaligned contacts, defective through-die vias, etc.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit device comprising:
a stacked die;
a base die having a first plurality of contacts disposed on a back side of the base die, a second plurality of contacts disposed on a face side of the base die, a first plurality of through-die vias coupled to the first plurality of contacts and coupled to programmable logic of the base die; a plurality of probe pads including a first probe pad configured to couple test input, a second probe pad configured to couple test output and a third probe pad configured to couple control signals; and test logic configured to couple to additional test logic of the stacked die so as to implement a scan chain for testing of the integrated circuit device;
wherein the stacked die is stacked on the back side of the base die and connected to the first plurality of contacts;
wherein the first probe pad, the second probe pad and the third probe pad are coupled directly to the test logic such that configuration of the programmable logic is not required for coupling the test input, the test output and the control signal between the base die and the stacked die so as to implement the scan chain; and
wherein the base die further includes a multiplexer having a first input coupled to the programmable logic of the base die, a second input coupled to the first probe pad with a first through-die via, and a control input coupled to the third probe pad with a second through-die via, the multiplexer being configured to select a signal from the programmable logic or test input from the first probe pad for the stacked die.

2. The integrated circuit device of claim 1 wherein all of the probe pads in the plurality of probe pads are disposed on the back side of the base die.

3. The integrated circuit device of claim 1 wherein all of the probe pads in the plurality of probe pads are disposed on the face side of the base die.

4. The integrated circuit device of claim 1 wherein the plurality of probe pads include a first plurality of probe pads that are disposed on the back side of the base die and a second plurality of probe pads that are disposed on the face side of the base die.

5. The integrated circuit device of claim 1 wherein the first probe pad, the second probe pad and the third probe pad are disposed on the back side of the base die and wherein the base die further comprises:
a second plurality of through-die vias that are dedicated to testing of the integrated circuit, the second plurality of through-die vias including the first through-die via that is electrically coupled to the first probe pad for coupling the test input, a third through-die via that is electrically coupled to the second probe pad for coupling the test output, and the third through-die via that is electrically coupled to the third probe pad for coupling the control signals; and
wherein the test logic is coupled to each of the probe pads in the plurality of probe pads, coupled to each of the through-die vias in the first plurality of through-die vias and coupled to each of the through-die vias in the second plurality of through-die vias.

6. The integrated circuit device of claim 5, wherein the test logic includes:
a plurality of multiplexers, each of the multiplexers in the plurality of multiplexers electrically coupled to the second through-die via for receiving the control signals, and each of the multiplexers in the plurality of multiplexers coupled to one of the through-die vias in the first plurality of through-die vias; and
a plurality of registers, each of the registers in the plurality of registers including an input that is coupled to one of the through-die vias in the first plurality of through-die vias and each of the registers in the plurality of registers including an output that is coupled to an input of one of the multiplexers in the plurality of multiplexers.

7. The integrated circuit device of claim 6, wherein the plurality of multiplexers includes the first multiplexer having an input that is coupled to the first through-die via, a second multiplexer having an output that is coupled to the third through-die via, and additional multiplexers, each of the additional multiplexers having an input that is coupled to an output of one of the registers, having an input that is coupled to the programmable logic and having an output that is coupled to one of the through-die vias in the first plurality of through-die vias.

8. The integrated circuit device of claim 7, wherein the plurality of probe pads include a fourth probe pad configured to couple clock signals, the fourth probe pad coupled to each of the multiplexers in the plurality of multiplexers and electrically coupled to each of the registers.

9. The integrated circuit device of claim 1, wherein the base die comprises a programmable logic device.

10. An integrated circuit die having a routing fabric and having at least one interface tile that is coupled to the routing fabric of the integrated circuit die, the interface tile further comprising:
a first plurality of through-die vias coupled to a stacked die disposed on a back side of the integrated circuit die and coupled to the routing fabric;
a plurality of probe pads on the back side of the integrated circuit die, the plurality of probe pads including a first probe pad configured to couple test input, a second probe pad configured to couple test output and a third probe pad configured to couple control signals;
a second plurality of through-die vias, the second plurality of through-die vias including a first through-die via that is electrically coupled to the first probe pad for coupling the test input, a second through-die via that is electrically coupled to a second probe pad for coupling the test output, and a third through-die via that is electrically coupled to a third probe pad for coupling the control signals; and
test logic coupled to each of the probe pads in the plurality of probe pads, coupled to each of the through-die vias in the first plurality of through-die vias and coupled to each of the through-die vias in the second plurality of through-die vias, the test logic configured to couple to additional test logic of a stacked die so as to implement a scan chain.

11. The integrated circuit die of claim 10, further comprising a set of contact pads located on a front side of the integrated circuit die that couple signals between the integrated circuit die and external circuitry during normal operation of the integrated circuit die and wherein the first plurality of vias are configured to couple the routing fabric to the stacked die during normal operation of the integrated circuit die.

12. The integrated circuit die of claim 10, wherein the first probe pad, the second probe pad and the third probe pad are coupled directly to the test logic such that configuration of the routing fabric is not required for coupling the test input, the test output and the control signal to the test logic so as to implement the scan chain.

13. The integrated circuit die of claim 12, wherein the test logic includes:
a plurality of multiplexers, each of the multiplexers in the plurality of multiplexers electrically coupled to the third through-die via for receiving the control signals, and each of the multiplexers in the plurality of multiplexers coupled to one of the through-die vias in the first plurality of through-die vias; and
a plurality of registers, each of the registers in the plurality of registers including an input that is coupled to one of the through-die vias in the first plurality of through-die vias and each of the registers in the plurality of registers including an output that is coupled to an input of one of the multiplexers in the plurality of multiplexers.

14. The integrated circuit die of claim 13, wherein:
the plurality of multiplexers include a first multiplexer having an input that is coupled to the first through-die via, a second multiplexer having an output that is coupled to the second through-die via, and additional multiplexers,
each of the additional multiplexers having:
an input that is coupled to an output of one of the registers,
an input that is coupled to the routing fabric of the integrated circuit die, and
an output that is coupled to one of the through-die vias in the first plurality of through-die vias.

15. The integrated circuit die of claim 14, wherein the plurality of probe pads include a fourth probe pad configured to couple clock signals, the fourth probe pad coupled to each of the multiplexers in the plurality of multiplexers and electrically coupled to each of the registers.

16. The integrated circuit die of claim 10, wherein:
the integrated circuit die includes a plurality of additional probe pads located on a front side of the integrated circuit die, the plurality of additional probe pads including:
a fourth probe pad that directly couples test input to the test logic,
a fifth probe pad that directly couples test output from the test logic and a
sixth probe pad that couples control signals to the test logic, and
wherein a stand-alone testing device can be coupled to the plurality of additional probe pads and the stand-alone testing device can be operated using only the plurality of additional probe pads, without configuring the integrated circuit die.

17. A method for testing comprising:
forming on a semiconductor wafer, a programmable integrated circuit die that includes programmable logic, a plurality of through-die vias coupled to test logic of the programmable integrated circuit die, a plurality of probe pads including at least first, second, and third probe pads directly coupled to the test logic, and a multiplexer having a first input coupled to the programmable logic, a second input coupled to the first probe pad with a first through-die via, and a control input coupled to the third probe pad with a second through-die via;
attaching a stacked die to a back side of the programmable integrated circuit die, the stacked die including additional test logic that couples to the test logic of the programmable integrated circuit die;
wherein the multiplexer is configured to select a signal from the programmable logic or test input from the first probe pad for input to the stacked die;

coupling a stand-alone testing device to the plurality of probe pads; and operating the stand-alone testing device so as to test the programmable integrated circuit die, the operating performed without configuration of the programmable integrated circuit die.

18. The method of claim 17 wherein the operating is performed prior to singulation of the programmable integrated circuit die and wherein all of the plurality of probe pads are on the back side of the programmable integrated circuit die.

19. The method of claim 18 wherein:

the forming on a semiconductor wafer, a programmable integrated circuit die that includes a plurality of through-die vias comprises:

forming the plurality of through-die vias, and supporting the wafer by a handling wafer during a wafer thinning process in which the plurality of through-die vias are exposed, and the attaching a stacked die, coupling a stand-alone testing device, and operating the stand-alone testing device are performed without separating the semiconductor wafer from the handling wafer.

20. The method of claim 18 wherein the operating the stand-alone testing device comprises:

sending control signals from the stand-alone testing device to the third probe pad;

sending test data from the stand-alone testing device to the first probe pad;

sending test output from the second probe pad to the stand-alone testing device; and analyzing the test output at the stand-alone testing device to identify defects.

* * * * *